US012647078B2

(12) United States Patent
Kang et al.

(10) Patent No.: US 12,647,078 B2
(45) Date of Patent: Jun. 2, 2026

(54) INTERPOLATED POWER TRACKING AND INPUT POWER ADJUSTMENT BASED ON PEAK-TO-AVERAGE POWER RATIO

(71) Applicant: QUALCOMM Incorporated, San Diego, CA (US)

(72) Inventors: Intae Kang, San Diego, CA (US); Song Tian, San Diego, CA (US); Islam El Bakoury, Malden, MA (US); Li Gao, San Diego, CA (US); Hakan Inanoglu, Acton, MA (US)

(73) Assignee: QUALCOMM Incorporated, San Diego, CA (US)

( * ) Notice: Subject to any disclaimer, the term of this patent is extended or adjusted under 35 U.S.C. 154(b) by 313 days.

(21) Appl. No.: 18/340,480

(22) Filed: Jun. 23, 2023

(65) Prior Publication Data

US 2024/0429883 A1 Dec. 26, 2024

(51) Int. Cl.
*H03F 3/24* (2006.01)
*H03F 1/02* (2006.01)
(Continued)

(52) U.S. Cl.
CPC ........... *H03F 3/245* (2013.01); *H03F 1/0222* (2013.01); *H03F 1/3241* (2013.01); *H03F 3/195* (2013.01); *H04B 1/0458* (2013.01); *H03F 2200/105* (2013.01); *H03F 2200/451* (2013.01); *H04B 2001/0408* (2013.01)

(58) Field of Classification Search
CPC ...... G09G 1/20; H01J 2229/507; H01J 29/48; H01J 29/563; H03F 1/0222; H03F 1/0227; H03F 1/3241; H03F 2200/102; H03F 2200/105; H03F 2200/451; H03F 3/19; H03F 3/195; H03F 3/245; H03G 3/3036;
(Continued)

(56) References Cited

U.S. PATENT DOCUMENTS 9,729,110 B2 * 8/2017 Geng ........................ H03F 3/20
2011/0221527 A1 9/2011 Woo et al.
(Continued)

OTHER PUBLICATIONS

International Search Report and Written Opinion—PCT/US2024/030602—ISA/EPO—Oct. 16, 2024.
(Continued)

*Primary Examiner* — Nguyen T Vo
(74) *Attorney, Agent, or Firm* — Patterson + Sheridan, L.L.P. Qualcomm

(57) ABSTRACT

Certain aspects of the present disclosure generally relate to electronic components and, more particularly, to radio frequency front-end (RFFE) circuitry. One example apparatus may include a controller configured to: determine a first calibration point and a second calibration point for an amplifier, wherein the first calibration point is associated with a first supply voltage for the amplifier, and wherein the second calibration point is associated with a second supply voltage for the amplifier; and determine an operating point for the amplifier by interpolating based on the first calibration point and the second calibration point, the operating point being associated with a third supply voltage. The apparatus may also include an interface configured to control a power supply to provide the third supply voltage associated with the operating point for the amplifier.

8 Claims, 9 Drawing Sheets

600

Determine a first calibration point and a second calibration point for an amplifier, wherein the first calibration point is associated with a first supply voltage for the amplifier, and wherein the second calibration point is associated with a second supply voltage for the amplifier — 602

Determine an operating point for the amplifier by interpolating based on the first calibration point and the second calibration point, the operating point being associated with a third supply voltage — 604

Control a power supply to provide the third supply voltage associated with the operating point to the amplifier — 606

(51) Int. Cl.
  *H03F 1/32*       (2006.01)
  *H03F 3/195*      (2006.01)
  *H04B 1/04*       (2006.01)
(58) Field of Classification Search
  CPC . H04B 1/0458; H04B 2001/0408; H04N 3/28
  See application file for complete search history.

(56)                 References Cited

U.S. PATENT DOCUMENTS

| | | | |
|---|---|---|---|
| 2013/0135045 A1* | 5/2013 | Khlat | H03F 1/0227 |
| | | | 330/127 |
| 2014/0292404 A1 | 10/2014 | Geng | |
| 2016/0072530 A1 | 3/2016 | El-Hassan et al. | |
| 2017/0093505 A1 | 3/2017 | Ripley et al. | |
| 2023/0085587 A1* | 3/2023 | Shute | H03F 3/213 |
| | | | 330/127 |

OTHER PUBLICATIONS

Partial International Search Report and Written Opinion—PCT/US2024/030602—ISA/EPO—Aug. 28, 2024.

* cited by examiner

600

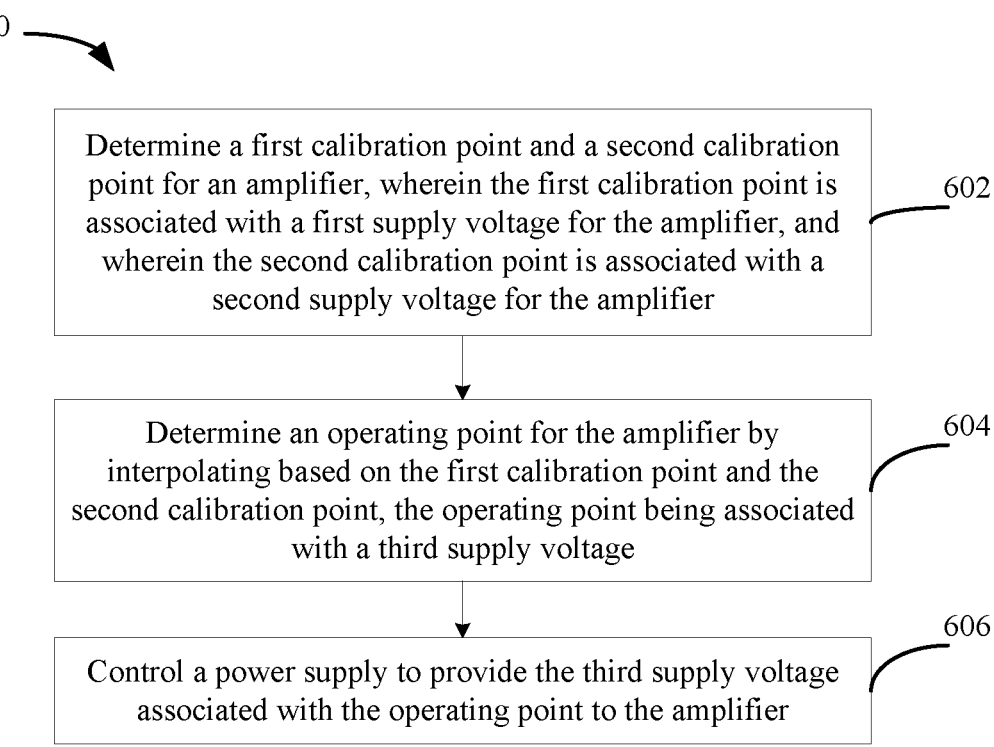

Determine a first calibration point and a second calibration point for an amplifier, wherein the first calibration point is associated with a first supply voltage for the amplifier, and wherein the second calibration point is associated with a second supply voltage for the amplifier

602

Determine an operating point for the amplifier by interpolating based on the first calibration point and the second calibration point, the operating point being associated with a third supply voltage

604

Control a power supply to provide the third supply voltage associated with the operating point to the amplifier

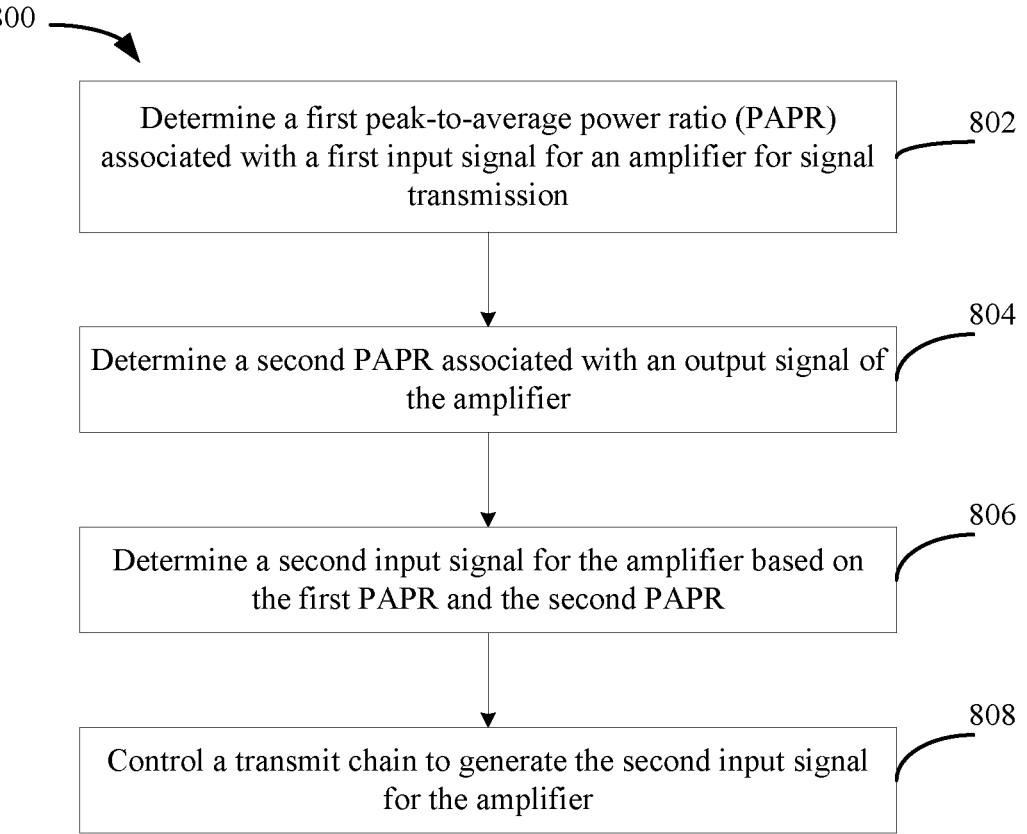

Determine a first peak-to-average power ratio (PAPR) associated with a first input signal for an amplifier for signal transmission — 802

Determine a second PAPR associated with an output signal of the amplifier — 804

Determine a second input signal for the amplifier based on the first PAPR and the second PAPR — 806

Control a transmit chain to generate the second input signal for the amplifier — 808

FIG. 8

INTERPOLATED POWER TRACKING AND INPUT POWER ADJUSTMENT BASED ON PEAK-TO-AVERAGE POWER RATIO

BACKGROUND

Field of the Disclosure

Certain aspects of the present disclosure generally relate to electronic components and, more particularly, to radio frequency front-end (RFFE) circuitry.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include a transceiver for processing signals for reception and/or transmission. A transceiver may include one or more transmit chains and one or more receive chains, which may include one or more amplifiers, one or more filters, and one or more mixers. The transmit chain may also include a power amplifier for amplifying an input signal for signal transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards an apparatus for wireless communication. The apparatus generally includes: a controller configured to: determine a first calibration point and a second calibration point for an amplifier, wherein the first calibration point is associated with a first supply voltage for the amplifier, and wherein the second calibration point is associated with a second supply voltage for the amplifier; and determine an operating point for the amplifier by interpolating based on the first calibration point and the second calibration point, the operating point being associated with a third supply voltage. The apparatus may also include an interface configured to control a power supply to provide the third supply voltage associated with the operating point for the amplifier.

Certain aspects of the present disclosure are directed towards a method for wireless communication. The method generally includes: determining a first calibration point and a second calibration point for an amplifier, wherein the first calibration point is associated with a first supply voltage for the amplifier, and wherein the second calibration point is associated with a second supply voltage for the amplifier; determining an operating point for the amplifier by interpolating based on the first calibration point and the second calibration point, the operating point being associated with a third supply voltage; and controlling a power supply to provide the third supply voltage associated with the operating point for the amplifier.

Certain aspects of the present disclosure are directed towards an apparatus for wireless communication. The apparatus generally includes control circuitry configured to: determine a first peak-to-average power ratio (PAPR) associated with a first input signal for an amplifier for signal transmission; determine a second PAPR associated with an output signal of the amplifier; and determine a second input signal for the amplifier based on the first PAPR and the second PAPR. The apparatus may also include an interface configured to control a transmit chain to generate the second input signal for the amplifier.

Certain aspects of the present disclosure are directed towards a method for wireless communication. The method generally includes: determining a first PAPR associated with a first input signal for an amplifier for signal transmission; determining a second PAPR associated with an output signal of the amplifier; determining a second input signal for the amplifier based on the first PAPR and the second PAPR; and controlling a transmit chain to generate the second input signal for the amplifier.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

FIG. 6 is a flow diagram depicting example operations for interpolated power tracking, in accordance with certain aspects of the present disclosure.

FIG. 8 is a flow diagram depicting example operations for peak-to-average power ratio (PAPR)-based input power adjustment, in accordance with certain aspects of the present disclosure.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure are directed toward techniques for operating an amplifier at compression using efficient power tracking (EPT). EPT typically uses discrete calibration points, which may result in an amplifier not operating at compression to meet a specified output power, resulting in reduced amplifier efficiency. Certain aspects of the present disclosure provide techniques for determining an operating point for the amplifier using interpolation based on calibration points. The operating point may be at a compression point of the amplifier, increasing amplifier efficiency. The determined operating point using interpolation may be implemented by providing an amplifier supply voltage that is different from the supply voltage associated with the calibration points, as described in more detail herein.

Some aspects of the present disclosure are directed to automatic input power adjustment using peak-to-average power ratio (PAPR). For example, input power may be adjusted based on an estimated error of the input power for operating an amplifier in compression. The error may be estimated using PAPR by comparing a PAPR of an input signal prior to digital pre-distortion and a PAPR associated with an output of the amplifier.

Example Wireless Communications

Figure 1:
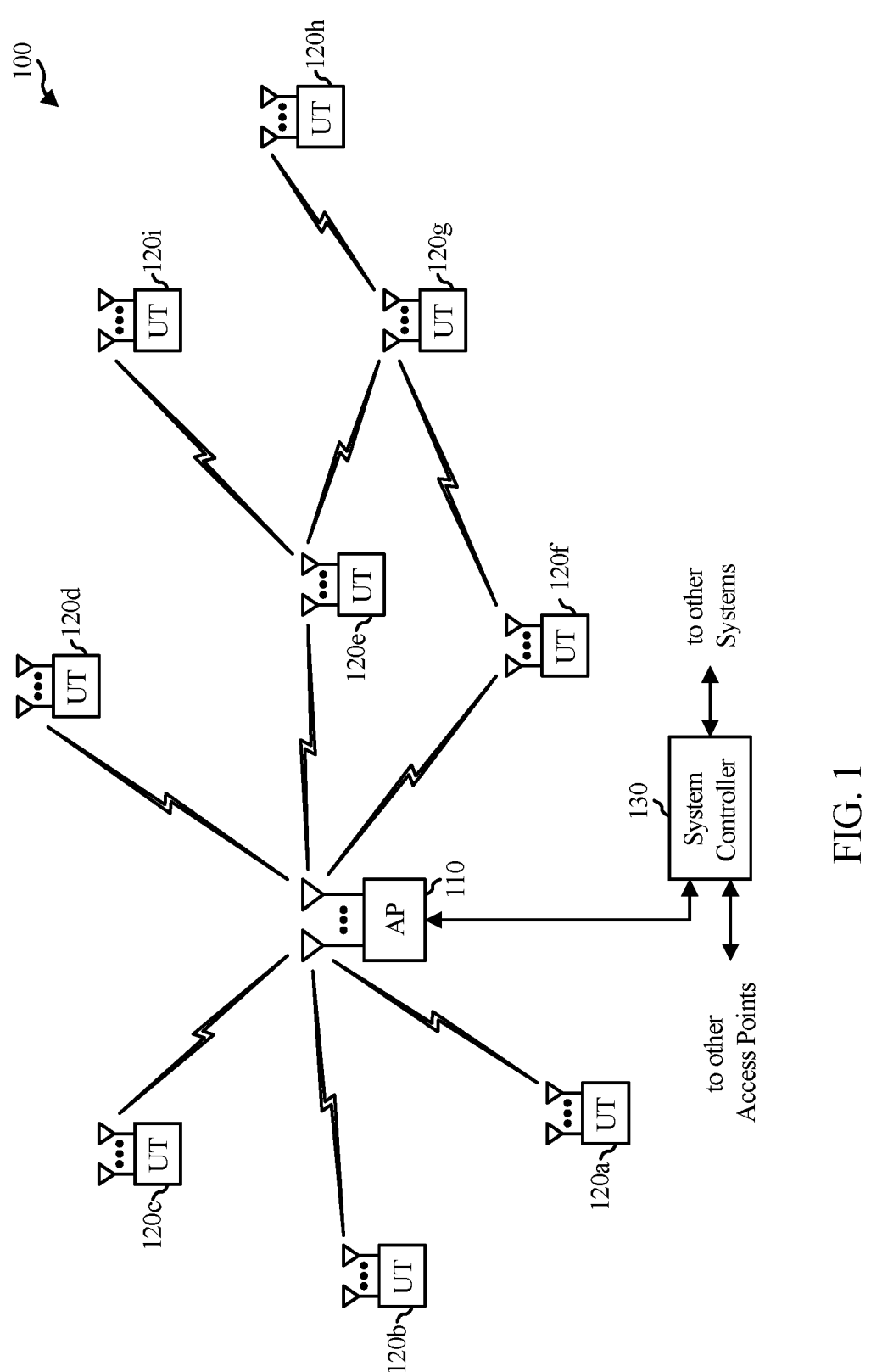
FIG. 1 is a diagram of an example wireless communications network, in which aspects of the present disclosure may be practiced.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported).

In some aspects, the user terminal 120 or access point 110 may include a controller that determines an operating point for an amplifier using interpolation based on calibration points. In certain aspects, the controller may estimate an error in input power for operating the amplifier in compression using peak-to-average power ratio (PAPR), and adjust the input power accordingly.

Figure 2:
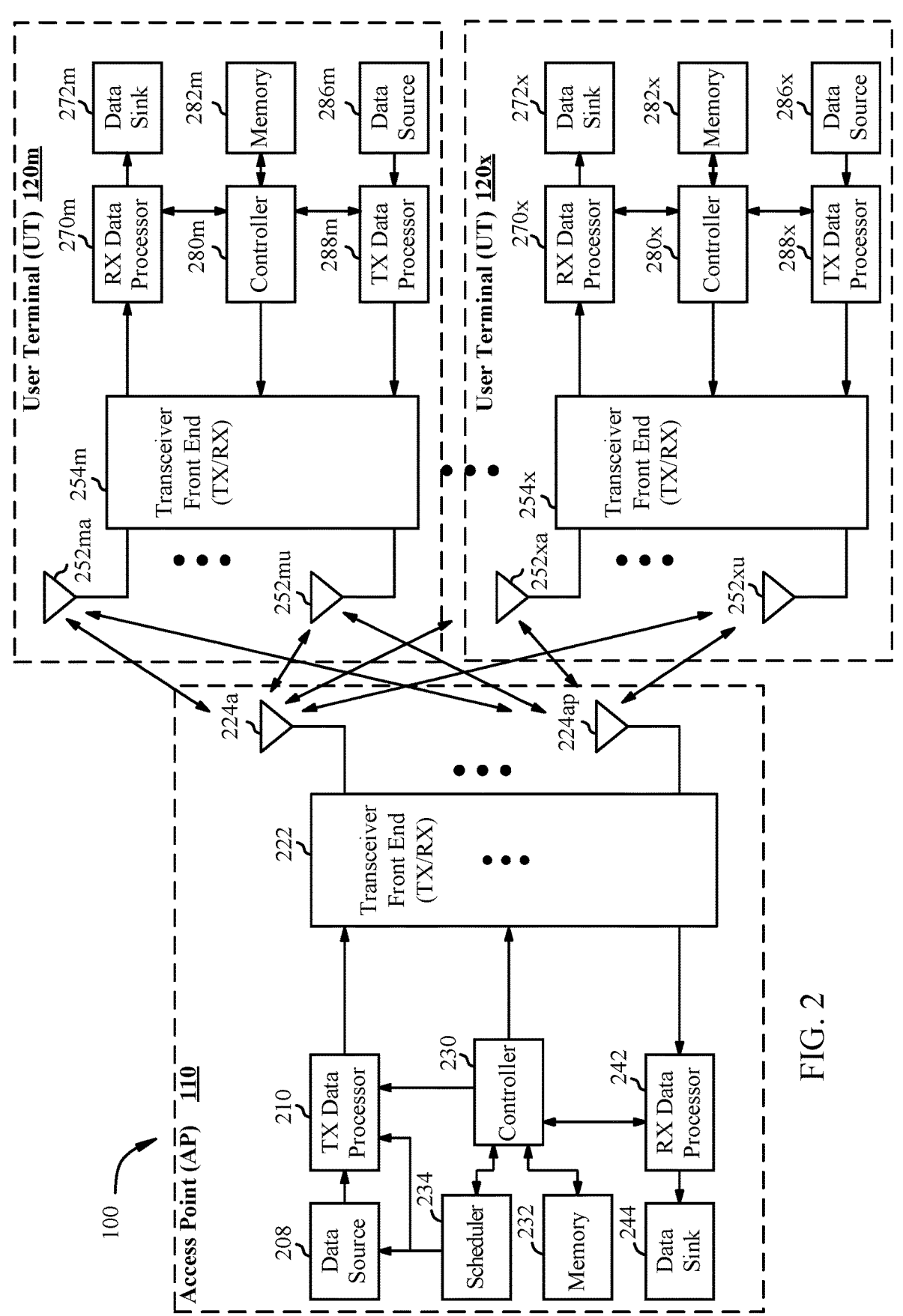
FIG. 2 is a block diagram of an example access point (AP) and example user terminals, in which aspects of the present disclosure may be practiced.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. Decoded data for each user terminal or access terminal may be provided to a data sink (e.g., data sink 244, data sink 272m, or data sink 272x) for storage and/or a controller for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
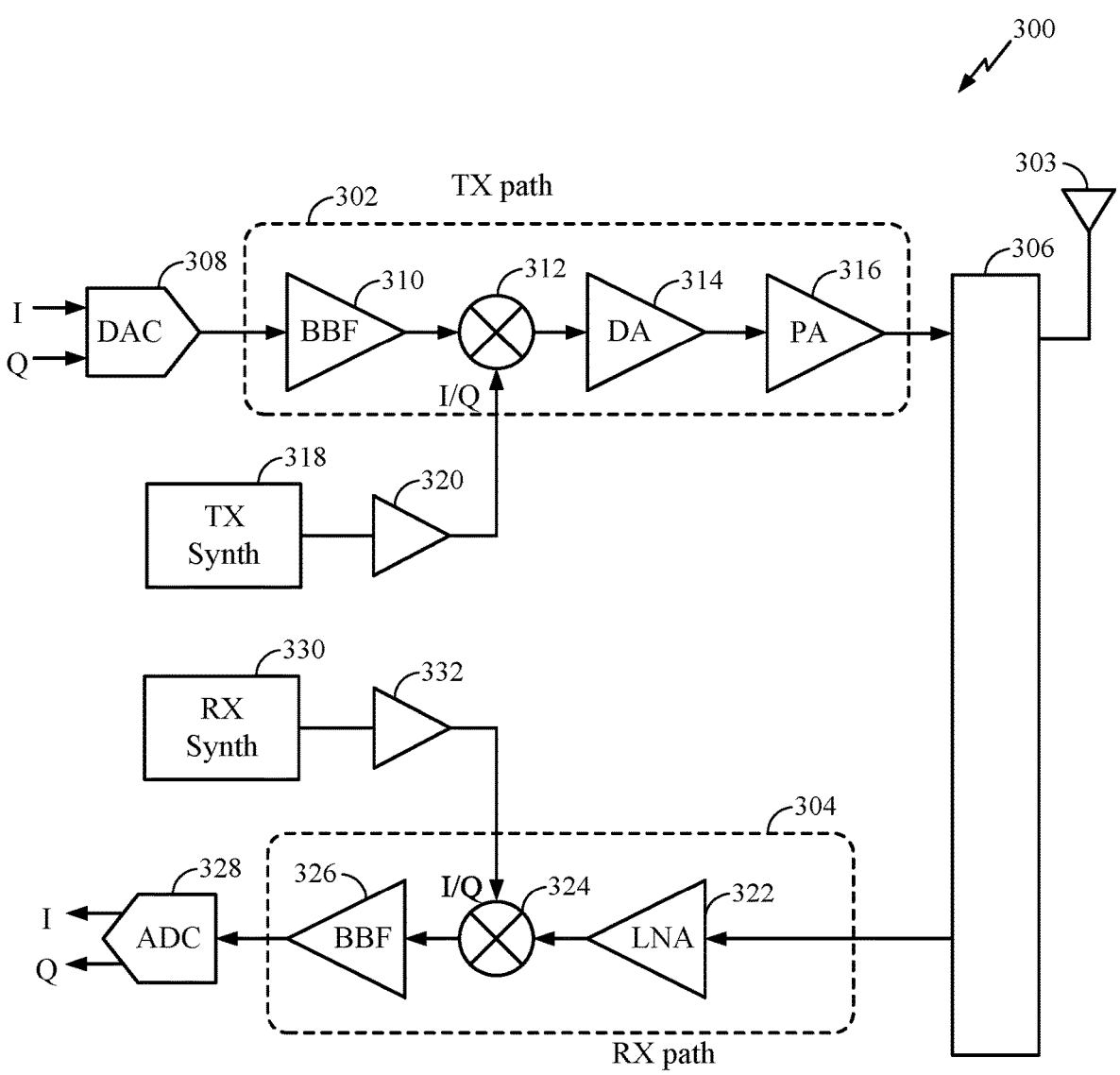
FIG. 3 is a block diagram of an example transceiver front end, in which aspects of the present disclosure may be practiced.

In some aspects, the controller (e.g., controller 230 or controller 280) may determine an operating point for an amplifier using interpolation based on calibration points. In certain aspects, the controller may estimate an error in input power for operating the amplifier in compression using peak-to-average power ratio (PAPR), and adjust the input power accordingly FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a "transmit chain") for transmitting signals via one or more antennas and a receive (RX) path 304 (also known as a "receive chain") for receiving signals via the antennas. When the TX path 302 and the RX path 304 share an antenna 303, the paths may be connected with the antenna via an interface 306, which may include any of various suitable radio frequency (RF) devices, such as a switch, a duplexer, a diplexer, a multiplexer, and the like.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In some cases, the PA 316 may be external to the RFIC.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

In some aspects, an operating point for the PA 316 may be determined using interpolation based on calibration points. An error in input power for operating the PA 316 in compression may be estimated using peak-to-average power ratio (PAPR), and the input power may be adjusted accordingly.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain RFFEs may employ frequency synthesizers with a variable-frequency oscillator (e.g., a voltage-controlled oscillator (VCO) or a digitally controlled oscillator (DCO))

to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

Example Techniques for Efficient Power Tracking

In some aspects, a power supply for the PA 316 may be implemented using efficient power tracking (e.g., EPT). In some aspects, the power supply may adjust the supply voltage for the PA 316 such that the supply voltage is based on a target output power at the antenna 303.

Figure 4:
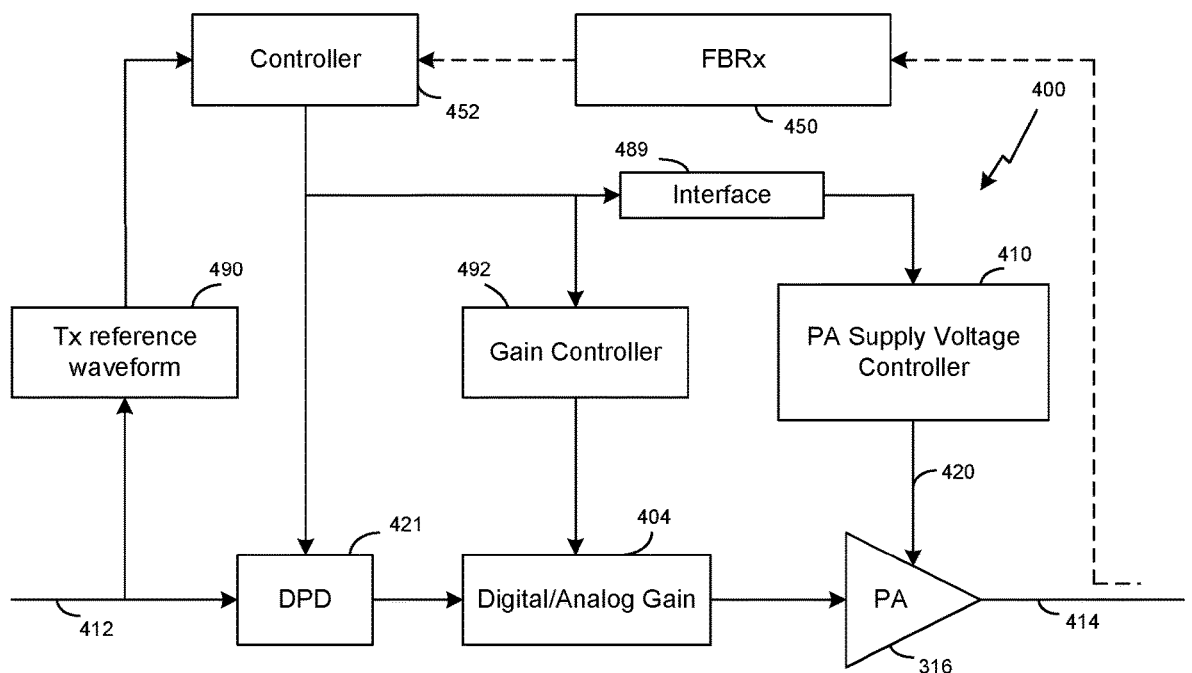
FIG. 4 illustrates example interpolated power tracking amplification circuitry, in accordance with certain aspects of the present disclosure.

FIG. 4 illustrates example efficient power tracking amplification circuitry 400. As illustrated, the PA 316 may amplify an input signal 412. The input signal 412 may represent an in-phase (I) or quadrature-phase (Q) signal (e.g., from the transceiver/front end 300). In some cases, the input signal may form an input to digital pre-distortion (DPD) circuitry 421. The DPD circuitry 421 may perform pre-distortion of the input signal to increase linearity associated with the output signal of PA 316. The pre-distorted input signal may be provided to gain circuitry 404 (e.g., for applying a gain, either in the digital or analog domain, to the pre-distorted input signal), which generates an RF input signal for the PA 316.

The input signal 412 may be provided to a transmit reference waveform generator 490, which provides a signal representing a distribution of the input signal 412. The PA 316 generates an amplified output signal 414 based on the input signal 412. In some aspects, a feedback receiver (FBRx) 450 may be used to perform amplifier response measurements. For example, the output of the PA 316 may be coupled to a FBRx chain (e.g., similar to RX path 304 and ADC 328), providing a digital signal to a controller 452 (e.g., a baseband processor) for analysis of the amplifier's response. For example, the FBRx may be used to measure a PAPR at the output of the PA 316, as described in more detail herein. As shown, controller 452 may control a PA supply voltage controller 410 for the PA 316 via an interface 489 (e.g., communication bus). In addition, controller 452 may control the gain circuitry 404 via a gain controller 492. In some cases, the controller 452 may also control a look-up table for DPD.

Conventional power supplies may operate with increased (e.g., peak) efficiency when operating on a particular calibration point (e.g., an operating point at which the amplifier is determined to operate in compression). Multiple calibration points may be identified during calibration, with each calibration point covering a certain power range (e.g., about 2 dB power range).

Figure 5:
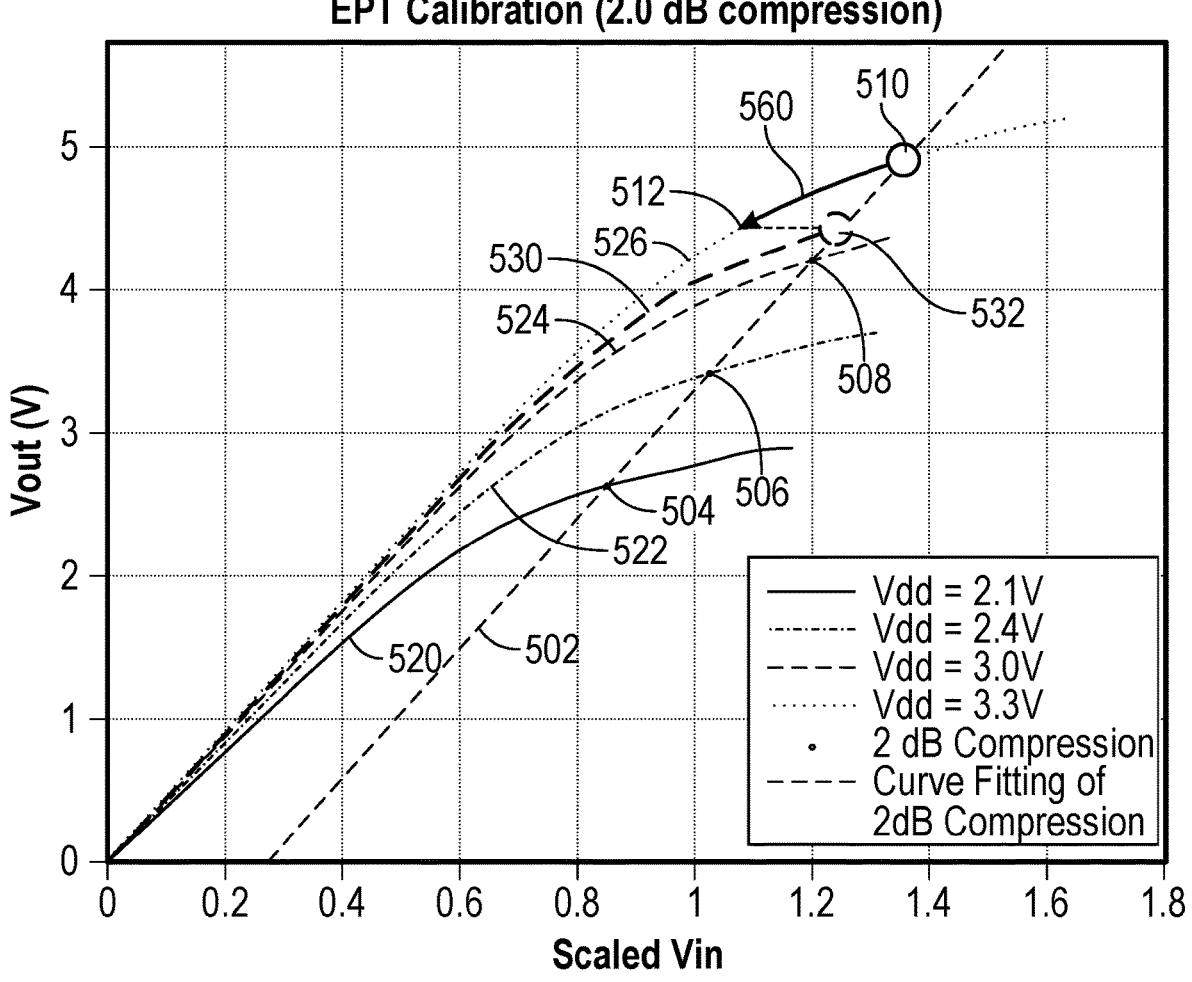
FIG. 5 is a graph illustrating calibration points associated with an amplifier, in accordance with certain aspects of the present disclosure.

FIG. 5 is a graph illustrating calibration points 504, 506, 508, 510 associated with PA 316. The PA 316 may have a different operating curve depending on the supply voltage. For example, operating curve 520 may correspond to a Vdd of 2.1 V, operating curve 522 may correspond to a Vdd of 2.4 V, operating curve 524 may correspond to a Vdd of 3.0 V, and operating curve 526 may correspond to a Vdd of 3.3 V. Operating curves 520, 522, 524, 526 may be determined during calibration (e.g., by sweeping an input power to the PA 316 and measuring the amplifier's response). At the calibration points 504, 506, 508, 510 (e.g., also referred to as "compression points"), the PA 316 operates in compression.

As shown, each of the calibration points 504, 506, 508, 510 may be associated with a specific supply voltage Vdd for the PA 316 on the compression curve 502. That is, each calibration point may be at an intersection between the compression curve 502 and an operating curve associated with the PA supply voltage. For example, calibration point 504 may be associated with Vdd of 2.1 V, calibration point 506 may be associated with Vdd of 2.4 V, calibration point 508 may be associated with Vdd of 3.0 V, and calibration point 508 may be associated with Vdd of 3.3 V. The PA 316 may operate at peak efficiency when operating in compression at one of the calibration points.

In existing EPT implementations, transmitter automatic gain control (TxAGC) settings operate with power back off from a calibration point (e.g., back off from calibration point 510 as shown by arrow 560). When transmit power is not at a particular calibration point, the same amplifier bias (e.g., supply voltage) associated with the calibration point may be used, but the amplifier input signal digital gain may be backed off to meet the transmit power (e.g., resulting in the amplifier operating at lighter compression). For example, if operating at calibration point 510 (e.g., corresponding to an input voltage Vin of about 1.3 V and output voltage (Vout) of 4.9 V at a supply voltage of 3.3 V), and the output voltage is to be reduced to 4.3 V, the same supply voltage of 3.3 V may be applied. The input voltage Vin may be reduced to about 1.1 V to supply the output voltage of 4.3 V, resulting in the PA 316 operating at operating point 512 which is not on the compression curve 502. Thus, the PA 316 may no longer operate at compression, reducing amplifier efficiency. The power back-off results in power efficiency loss.

Certain aspects of the present disclosure are directed towards a power supply providing continuous adjusting of amplifier bias with finer resolution as compared to at least some conventional implementations. As described, existing power supplies with EPT may use discrete amplifier biases that are set based on calibration points. The present disclosure is directed to techniques for identifying an operating point and an associated amplifier supply voltage using interpolation based on calibration points. For instance, an operating point 532 may be identified using interpolation based on calibration points 508, 510. The operating point 532 may correspond to a supply voltage for PA 316 that is between 3.0 V (e.g., associated with calibration point 508) and 3.3 V (e.g., associated with calibration point 510). Thus, the power supply (e.g., power supply 410) may generate the supply voltage for the operating point so that the PA 316 operates on the operating curve 530 (e.g., TxAGC is set based on curve 530). Thus, instead of operating at operating point 512, the PA 316 may operate at operating point 532 at compression (e.g., on the compression curve 502).

FIG. 6 is a flow diagram depicting example operations 600 for wireless communication, in accordance with certain aspects of the present disclosure. For example, the operations 600 may be performed by a controller, such as the controller 230.

The operations 600 begin, at block 602, with the controller determining a first calibration point (e.g., calibration point 508) and a second calibration point (e.g., calibration points 510) for an amplifier (e.g., PA 316). The first calibration point may be associated with a first supply voltage (e.g., Vdd of 3.0 V), and the second calibration point may be associated with a second supply voltage (e.g., Vdd of 3.3 V). In some aspects, the first calibration point may be determined based on an amplifier (e.g., PA) supply voltage and a voltage at an input of the amplifier.

At block 604, the controller determines an operating point (e.g., operating point 532) for the amplifier by interpolating based on the first operating point and the second operating point. The operating point may be associated with a third supply voltage (e.g., between the first supply voltage and the second supply voltage).

At block 606, the controller controls a power supply to provide the third supply voltage associated with the operating point to the amplifier. In some aspects, the operating point is associated with an input power (e.g., Vin) to the amplifier. The controller may control a transmit chain to generate an input signal to the amplifier based on the input power to meet a particular output power for the signal transmission.

In some aspects, the operating point includes a compression point of the amplifier. Each of the first calibration point and the second calibration point may include a compression point on an operating curve (e.g., operating curve 522 or operating curve 526) of the amplifier. The operating point may be determined based on an interpolated power of two calibration points for the amplifier, in some aspects.

Example Techniques for Input Power Error Estimation Using Peak-to-Average Power Ratio In some cases, input power (Pin) error may be estimated for Pin adjustment by comparing the amplifier's response to calibration data. However, as described in more detail herein, it may be difficult to estimate Pin error when power back-off for signal transmission is large or the transmission PAPR is small. Certain aspects of the present disclosure provide an automatic Pin adjustment technique using peak-to-average power ratio (PAPR) (e.g., referred to as PAPR-AP). For example, certain aspects provide a PAPR-based input power error estimation technique used to adjust amplifier Pin.

Figures 7A, 7B, 7C:
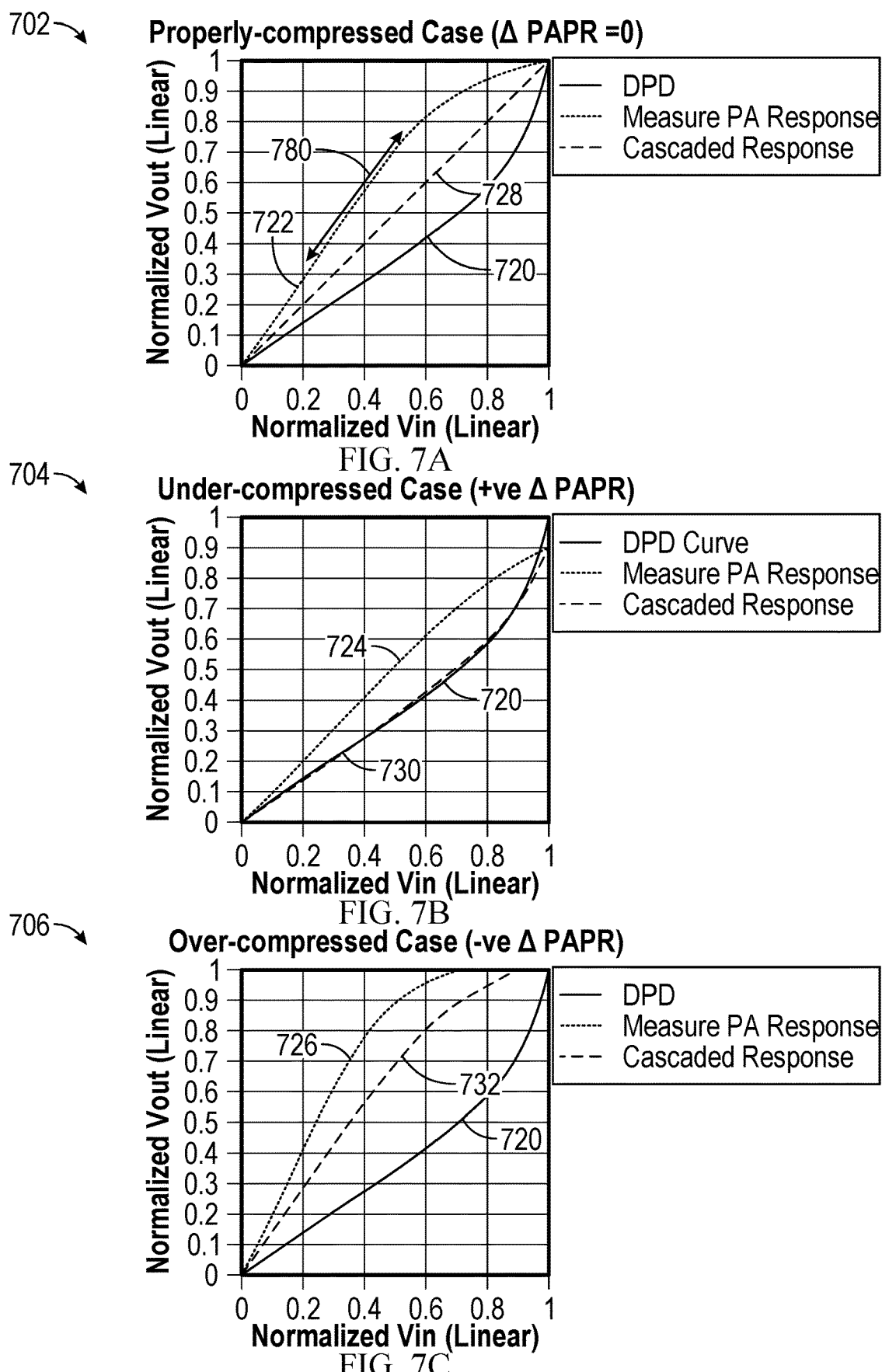
FIGS. 7A, 7B, and 7C illustrate an amplifier's response during different operating conditions, in accordance with certain aspects of the present disclosure.

FIGS. 7A, 7B, and 7C illustrate an amplifier's response during different operating conditions. FIG. 7A illustrates a measured amplifier response (shown by measured response curve 722) when operating in compression, FIG. 7B illustrates a measured amplifier response (shown by measured response curve 724) when under-compressed, and FIG. 7C illustrates a measured amplifier response (shown by measured response curve 726) when over-compressed. The amplifier's response may be measured by sweeping input power to the amplifier and measuring the amplifier's response to the sweep.

The amplifier's response may vary over frequency and temperature. For example, the PA 316 may be under-compressed during hot conditions (e.g., high temperature) as shown in FIG. 7B, while over-compressed during cold conditions, as shown in FIG. 7C. In some cases, DPD (e.g., distortion of input signaling in the digital domain) may be used to compensate for the non-linearity of the PA 316. The graphs 702, 704, 706 also show a DPD curve 720 that may be used to perform distortion of the input signal (e.g., using DPD circuitry 421 as described with respect to FIG. 4). The graphs 702, 704, 706 also show the PA's response with DPD (e.g., shown by curves 728, 730, 732), which may be measured using an FBRx.

In order to configure the PA 316 to operate at the same target compression point with varied conditions, Pin of the PA 316 may be adjusted. The DPD may provide a linear system with proper Pin adjustment, hence meeting error vector magnitude (EVM) and/or adjacent channel leakage ratio (ACLR) performance specifications. However, as described, it may be difficult to estimate input power error for operating at compression due to difficulties in the detection of the amplifier's response (e.g., by merely comparing the amplifier's response to calibration data). For example, if the transmission waveform to be used has a small PAPR and/or the digital back-off power is large, the amplifier response measurement samples may be focused on a region of operation (e.g., region of operation 780) that may not allow for the proper estimation of Pin error (e.g., since the measurement samples do not provide information about amplifier response at higher power regions).

Certain aspects use PAPR as a metric to estimate input power error. Based on PAPR, Pin may be adjusted iteratively. For example, input power may be adapted iteratively based on a difference between a measured PAPR (e.g., as measured based on a feedback receiver (FBRx)) and transmitter (Tx) reference captures (e.g., PAPR prior to DPD, referred to herein as "transmit PAPR").

If operating at a target compressed point as shown in graph 702, the FBRx measured PAPR may be the same as the transmit PAPR (e.g., PAPR difference is zero). If under compressed as shown in graph 704, the FBRx measured PAPR may be higher than the transmit PAPR, resulting in a positive PAPR difference. If over-compressed as shown in graph 706, FBRx PAPR may be lower than the transmit PAPR, resulting in a negative PAPR difference.

To determine the PAPR difference, a transmit PAPR may be measured prior to DPD (e.g., at the input of the DPD circuitry 421) and a PAPR may be measured at the output of the PA 316 (e.g., via FBRx). The two measured PAPRs may be compared to identify a PAPR difference. If the PAPR difference is positive (e.g., FBRx PAPR is higher than the transmit PAPR), the amplifier may be under-compressed. Thus, Pin may be increased. If the PAPR difference is negative (e.g., FBRx PAPR is lower than the transmit PAPR), the amplifier may be under-compressed. Thus, Pin may be decreased.

FIG. 8 is a flow diagram depicting example operations 800 for wireless communication, in accordance with certain aspects of the present disclosure. For example, the operations 800 may be performed by control circuitry, such as the controller 230, and in some aspects, a PAPR determination circuit such as the PAPR determination circuit 900 of FIG. 9.

The operations 800 begin, at block 802, with the control circuitry determining a first PAPR associated with a first input signal for an amplifier for signal transmission. For example, the PAPR may be associated with an input signal prior to DPD (e.g., at an input of the DPD circuitry 421).

At block 804, the control circuitry determines a second PAPR associated with an output signal of the amplifier. For example, the second PAPR may be determined based on feedback signaling received from a feedback receiver (e.g., receiver 450) coupled between an output of the amplifier and the control circuitry.

At block 806, the control circuitry determines a second input signal for the amplifier based on the first PAPR and the second PAPR. For example, the second input signal may be determined to be less than the first input signal based on the second PAPR being greater than the first PAPR. The second input signal may be determined to be greater than the first input signal based on the second PAPR being less than the first PAPR. The second input signal may be determined to operate the amplifier in compression. At block 808, the control circuitry controls a transmit chain to generate the second input signal for the amplifier.

Certain aspects of the present disclosure provide an interpolated EPT technique that provides higher power efficiency on average as compared to at least some conventional EPT techniques. For example, the aspects described herein allow the PA to operate at a target compression point. Moreover, the PAPR-based error estimation technique described herein is more robust to use as compared to at least some conventional input power error estimation techniques. The PAPR-based error estimation technique also reduces calibration time (e.g., since no calibration may be used for Pin estimation). The EPT and PAPR-based Pin error estimation techniques are less complex than existing EPT and Pin error estimation techniques (e.g., involve fewer calculations).

Figure 9:
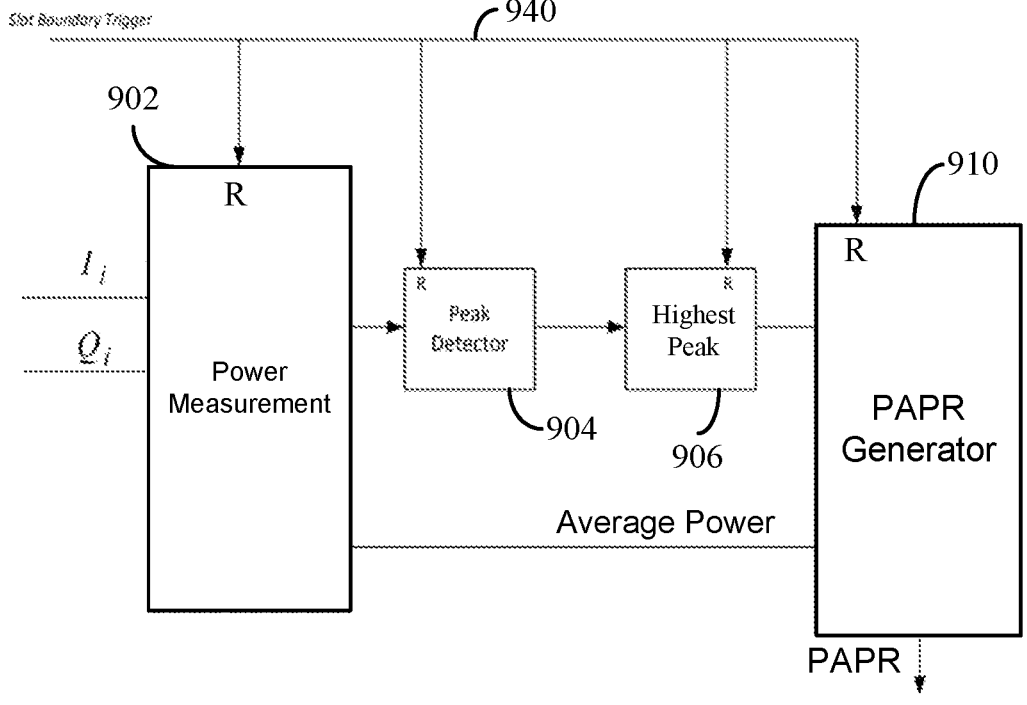
FIG. 9 illustrates a PAPR determination circuit, in accordance with certain aspects of the present disclosure.

FIG. 9 illustrates a PAPR determination circuit 900, in accordance with certain aspects of the present disclosure. The PAPR determination circuit 900 may include a power measurement circuit 902 that receives I and Q signals and outputs power measurement signals. For example, the power measurement circuit 902 may provide power measurements to a peak detector 904. The peak detector 904 may detect peaks associated the power measurements which may be provided to a highest peak detector circuit 906. The highest peak detector circuit 906 may output a highest peak within a certain measurement window (e.g., within a slot based on a slot boundary trigger signal 940) to a PAPR generator 910. The power measurement circuit 902 may also provide an average power measurement to the PAPR generator 910. Based on the highest peak and the average power measurement, the PAPR generator 910 may generate a signal representing PAPR. As shown, the power measurement circuit 902, peak detector 904, highest peak detector circuit 906, and PAPR generator 910 may be reset via the slot boundary trigger signal 940.

Example Aspects

In addition to the various aspects described above, specific combinations of aspects are within the scope of the disclosure, some of which are detailed below:

Aspect 1: An apparatus for wireless communication, comprising: a controller configured to: determine a first calibration point and a second calibration point for an amplifier, wherein the first calibration point is associated with a first supply voltage for the amplifier, and wherein the second calibration point is associated with a second supply voltage for the amplifier; and determine an operating point for the amplifier by interpolating based on the first calibration point and the second calibration point, the operating point being associated with a third supply voltage; and an interface configured to control a power supply to provide the third supply voltage associated with the operating point for the amplifier.

Aspect 2: The apparatus of Aspect 1, wherein the third supply voltage is between the first supply voltage and the second supply voltage.

Aspect 3: The apparatus of Aspect 1 or 2, wherein: the operating point is associated with an input power to the amplifier; and the interface is further configured to control a transmit chain to generate an input signal to the amplifier based on the input power to meet a particular output power for signal transmission.

Aspect 4: The apparatus according to any of Aspects 1-3, wherein the operating point comprises a compression point of the amplifier.

Aspect 5: The apparatus according to any of Aspects 1-4, wherein each of the first calibration point and the second calibration point includes a compression point on an operating curve of the amplifier.

Aspect 6: The apparatus according to any of Aspects 1-5, wherein the amplifier comprises a power amplifier.

Aspect 7: A method for wireless communication, comprising: determining a first calibration point and a second calibration point for an amplifier, wherein the first calibration point is associated with a first supply voltage for the amplifier, and wherein the second calibration point is associated with a second supply voltage for the amplifier; determining an operating point for the amplifier by interpolating based on the first calibration point and the second calibration point, the operating point being associated with a third supply voltage; and controlling a power supply to provide the third supply voltage associated with the operating point for the amplifier.

Aspect 8: The method of Aspect 7, wherein the third supply voltage is between the first supply voltage and the second supply voltage.

Aspect 9: The method of Aspect 7 or 8, wherein: the operating point is associated with an input power to the amplifier; and the method further comprises controlling a transmit chain to generate an input signal to the amplifier based on the input power to meet a particular output power for signal transmission.

Aspect 10: The method according to any of Aspects 7-9, wherein the operating point comprises a compression point of the amplifier.

Aspect 11: The method according to any of Aspects 7-10, wherein each of the first operating point and the second operating point includes a compression point on an operating curve of the amplifier.

Aspect 12: The method according to any of Aspects 7-11, wherein the amplifier comprises a power amplifier.

Aspect 13: An apparatus for wireless communication, comprising: control circuitry configured to: determine a first peak-to-average power ratio (PAPR) associated with a first input signal for an amplifier for signal transmission; determine a second PAPR associated with an output signal of the amplifier; and determine a second input signal for the amplifier based on the first PAPR and the second PAPR; and an interface configured to control a transmit chain to generate the second input signal for the amplifier.

Aspect 14: The apparatus of Aspect 13, wherein the second PAPR is determined based on feedback signaling received from a feedback receiver coupled between an output of the amplifier and the control circuitry.

Aspect 15: The apparatus of Aspect 14, wherein the first input signal comprises a signal at an input of a digital pre-distortion (DPD) circuit coupled to an input of the amplifier.

Aspect 16: The apparatus according to any of Aspects 13-15, wherein the second input signal is determined to be less than the first input signal based on the second PAPR being greater than the first PAPR.

Aspect 17: The apparatus according to any of Aspects 13-16, wherein the second input signal is determined to be greater than the first input signal based on the second PAPR being less than the first PAPR.

Aspect 18: The apparatus according to any of Aspects 13-17, wherein the control circuitry is configured to determine the second input signal to operate the amplifier in compression.

Aspect 19: The apparatus according to any of Aspects 13-18, wherein the control circuitry comprises a PAPR determination circuit configured to determine at least one of the first PAPR or the second PAPR.

Aspect 20: A method for wireless communication, comprising: determining a first peak-to-average power ratio (PAPR) associated with a first input signal for an amplifier for signal transmission; determining a second PAPR associated with an output signal of the amplifier; determining a second input signal for the amplifier based on the first PAPR and the second PAPR; and controlling a transmit chain to generate the second input signal for the amplifier.

Aspect 21: The method of Aspect 20, wherein the second PAPR is determined based on feedback signaling received from a feedback receiver.

Aspect 22: The method of Aspect 21, wherein the first input signal comprises a signal at an input of a digital pre-distortion (DPD) circuit coupled to an input of the amplifier.

Aspect 23: The method according to any of Aspects 20-22, wherein the second input signal is determined to be less than the first input signal based on the second PAPR being greater than the first PAPR.

Aspect 24: The method according to any of Aspects 20-23, wherein the second input signal is determined to be greater than the first input signal based on the second PAPR being less than the first PAPR.

Aspect 25: The method according to any of Aspects 20-24, wherein the second input signal is determined to operate the amplifier in compression.

ADDITIONAL CONSIDERATIONS

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

The apparatus and methods described in the detailed description are illustrated in the accompanying drawings by various blocks, modules, components, circuits, steps, processes, algorithms, etc. (collectively referred to as "elements"). The various operations or methods described above may be performed by any suitable means capable of performing the corresponding functions. The means may include various hardware and/or software component(s) and/or module(s), including, but not limited to a circuit, an application specific integrated circuit (ASIC), or processor.

Generally, where there are operations illustrated in figures, those operations may have corresponding counterpart means-plus-function components with similar numbering.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:
1. An apparatus for wireless communication, comprising:
a controller configured to:
   determine a first calibration point and a second calibration point for an amplifier, wherein the first calibration point is associated with a first supply voltage for the amplifier, and wherein the second calibration point is associated with a second supply voltage for the amplifier, wherein each of the first calibration point and the second calibration point includes a compression point at an intersection of an operating curve of the amplifier and a compression curve; and determine an operating point on the compression curve for the amplifier by interpolating based on the first calibration point and the second calibration point, the operating point being associated with a third supply voltage; and an interface configured to control a power supply to provide the third supply voltage associated with the operating point for the amplifier.

2. The apparatus of claim 1, wherein the third supply voltage is between the first supply voltage and the second supply voltage.

3. The apparatus of claim 1, wherein:

the operating point is associated with an input power to the amplifier; and the interface is further configured to control a transmit chain to generate an input signal to the amplifier based on the input power to meet a particular output power for signal transmission.

4. The apparatus of claim 1, wherein the amplifier comprises a power amplifier.

5. A method for wireless communication, comprising:

determining a first calibration point and a second calibration point for an amplifier, wherein the first calibration point is associated with a first supply voltage for the amplifier, wherein the second calibration point is associated with a second supply voltage for the amplifier, and wherein each of the first calibration point and the second calibration point includes a compression point at an intersection of an operating curve of the amplifier and a compression curve;

determining an operating point on the compression curve for the amplifier by interpolating based on the first calibration point and the second calibration point, the operating point being associated with a third supply voltage; and controlling a power supply to provide the third supply voltage associated with the operating point for the amplifier.

6. The method of claim 5, wherein the third supply voltage is between the first supply voltage and the second supply voltage.

7. The method of claim 5, wherein:

the operating point is associated with an input power to the amplifier; and the method further comprises controlling a transmit chain to generate an input signal to the amplifier based on the input power to meet a particular output power for signal transmission.

8. The method of claim 5, wherein the amplifier comprises a power amplifier.

*  *  *  *  *